United States Patent
Kim et al.

(10) Patent No.: US 9,140,729 B2
(45) Date of Patent: Sep. 22, 2015

(54) METHOD AND APPARATUS FOR PROVIDING ESTIMATED POWER CONSUMPTION INFORMATION OF CONTENT

(71) Applicant: Samsung Electronics Co., Ltd., Gyeonggi-do (KR)

(72) Inventors: Kwang-hyuk Kim, Gyeonggi-do (KR); Hue-yin Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/028,962

(22) Filed: Sep. 17, 2013

(65) Prior Publication Data

US 2014/0019073 A1    Jan. 16, 2014

Related U.S. Application Data

(63) Continuation of application No. 12/959,998, filed on Dec. 3, 2010, now Pat. No. 8,566,048.

(30) Foreign Application Priority Data

Dec. 4, 2009   (KR) .................. 10-2009-0119914

(51) Int. Cl.
  *G01R 21/00*   (2006.01)
  *G01R 21/133*  (2006.01)
  *G01R 31/36*   (2006.01)

(52) U.S. Cl.
  CPC ............ *G01R 21/00* (2013.01); *G01R 21/1338* (2013.01); *G01R 31/3693* (2013.01)

(58) Field of Classification Search
  CPC ....................................... G01R 21/00
  USPC ............................................ 702/61
  See application file for complete search history.

(56) References Cited

U.S. PATENT DOCUMENTS

| | | | |
|---|---|---|---|
| 8,231,233 B2 * | 7/2012 | Schuler et al. | 353/121 |
| 8,321,629 B2 * | 11/2012 | Hayashi et al. | 711/114 |
| 2008/0268828 A1 | 10/2008 | Nagaraja | |
| 2010/0048139 A1 | 2/2010 | Seo et al. | |
| 2013/0131883 A1 * | 5/2013 | Yamada | 700/295 |

* cited by examiner

*Primary Examiner* — Bryan Bui
(74) *Attorney, Agent, or Firm* — The Farrell Law Firm, P.C.

(57) ABSTRACT

A method of providing estimated power consumption information when content is used, the method including receiving a command to select one of a plurality of content; receiving first device information indicating information about a first portable device of a first user who is to use the selected content; and providing power consumption information estimated when the first portable device uses the selected content, based on the first device information and a power consumption database generated by pre-measuring power consumption of the plurality of content in a predetermined reference device.

20 Claims, 4 Drawing Sheets

(a) ESTIMATED POWER CONSUMPTION : FIRST GRADE
(b) ESTIMATED POWER CONSUMPTION : ★
(c) ESTIMATED POWER CONSUMPTION : USE 100 W PER HOUR

METHOD AND APPARATUS FOR PROVIDING ESTIMATED POWER CONSUMPTION INFORMATION OF CONTENT

PRIORITY

This application is a Continuation application of U.S. application Ser. No. 12/959,998, which was filed in the U.S. Patent and Trademark Office on Dec. 3, 2010 and claims priority under 35 U.S.C. §119(a) to Korean Patent Application No. 10-2009-0119914, filed on Dec. 4, 2009, in the Korean Intellectual Property Office, the contents of each of which are incorporated herein by reference.

BACKGROUND OF THE INVENTION

1. Field of the Invention

The present invention relates generally to a method and apparatus for providing estimated power consumption information when content is used.

2. Description of the Related Art

As a convergence service between devices is considered to be important, the same content may be used in various devices. While, it is not important to determine the amount of power consumed by a device that has a continuous power supply, such as a Television (TV), it is important to determine the amount of power consumed by a portable device, such as a mobile phone, since the portable device is battery powered. Accordingly, a method of displaying consumed power while each device operates has been suggested.

SUMMARY OF THE INVENTION

The present invention provides a method and apparatus for providing estimated power consumption information when content is used.

According to an aspect of the present invention, there is provided a method of providing power consumption information about an amount of power estimated to be consumed while using content, the method including receiving a command to select one of a plurality of content; receiving first device information indicating information about a first portable device of a first user who is to use the selected content; and providing estimated power consumption information when the first portable device uses the selected content, based on the first device information and a power consumption database generated by pre-measuring power consumption of the plurality of content in a predetermined reference device.

According to another aspect of the present invention, there is provided an apparatus for providing estimated power consumption information when content is used, the apparatus including a receiver for receiving a command for selecting one of a plurality of content, and receiving first device information indicating information about a first portable device of a first user who is to use the selected content; and an information provider for providing estimated power consumption information when the first portable device uses the content, based on the first device information and a power consumption database generated by pre-measuring power consumption of the plurality of content in a predetermined reference device.

According to another aspect of the present invention, there is provided a computer readable recording medium having recorded thereon a program for executing a method of providing power consumption information about an amount of power estimated to be consumed while using content, the method including receiving a command to select one of a plurality of content; receiving first device information indicating information about a first portable device of a first user who is to use the selected content; and providing estimated power consumption information when the first portable device uses the selected content, based on the first device information and a power consumption database generated by pre-measuring power consumption of the plurality of content in a predetermined reference device.

BRIEF DESCRIPTION OF THE DRAWINGS

The above and other objects, features and advantages of certain embodiments of the present invention will become more apparent from the following detailed description when taken in conjunction with the accompanying drawings in which.

DETAILED DESCRIPTION OF EMBODIMENTS OF THE PRESENT INVENTION

Figure 1:
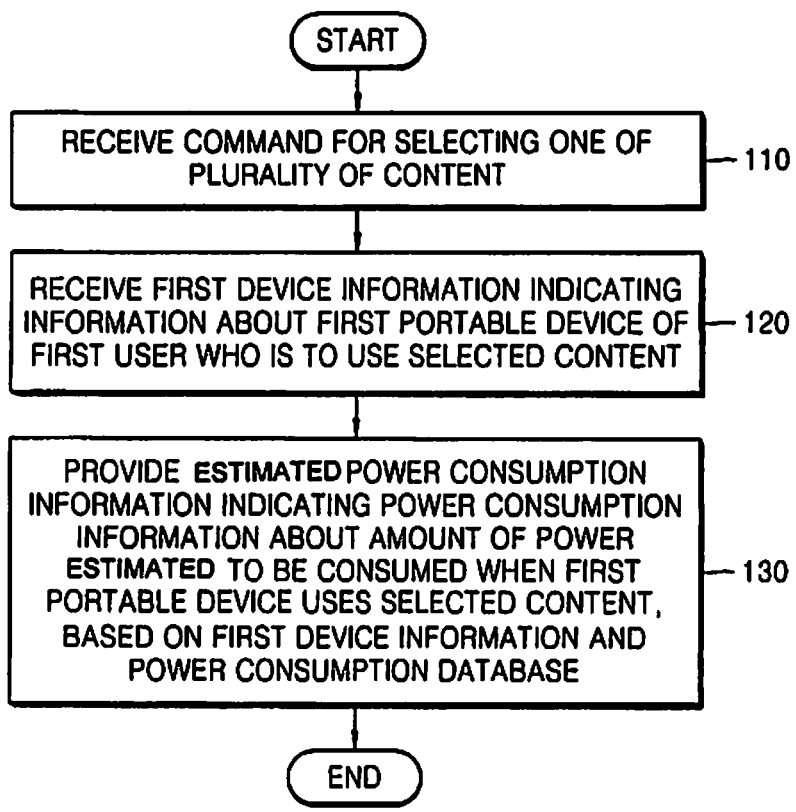
FIG. 1 is a flowchart illustrating a method of providing estimated power consumption information of content, according to an embodiment of the present invention.

Hereinafter, embodiments of the present invention will be described in detail with reference to the accompanying drawings. In the following description, the same elements will be designated by the same reference numerals when the same elements are shown in different drawings. Further, in the following description of the present invention, a detailed description of known functions and configurations incorporated herein will be omit when it may make the subject matter of the present invention rather unclear.

FIG. 1 is a flowchart illustrating a method of providing estimated power consumption information of content, according to an embodiment of the present invention.

Referring to FIG. 1, a command for selecting one of a plurality of content is received in step 110. Here, a subject that receives the command may be a server storing the plurality of content, and it is assumed that the server includes an apparatus (not shown) for providing estimated power consumption information, according to an embodiment of the present invention. However, the subject that receives the command is not limited to the server, and may be any type of device including the apparatus.

The plurality of content may be different types of content, such as moving image content, image content, game content, etc.

In step 120, first device information indicating information about a first portable device of a first user who is to use the selected content is received.

Here, the first device information may be transmitted from the first portable device to the server, or if the first device information is stored in a computer, from the computer to the server.

Here, a portable device may be a portable phone, a Personal Digital Assistant (PDA), or a laptop. Also, the first device information may include manufacturer information of the first portable device, a manufacturer model of the first portable device, and information about parts installed in the first portable device. Here, the information about the parts installed in the first portable device is information about types, sizes, etc. of the parts, such as a Central Processing Unit (CPU), a memory, a communication module, etc., which are installed in the first portable device.

Alternatively, the server may receive actual power consumption information generated by measuring actual power consumption while a second portable device of a second user uses the selected content, and second device information indicating information about the second portable device.

An order in which steps 110 and 120 are performed may be switched.

In step 130, estimated power consumption information indicating power consumption information estimated when the first portable device uses the selected content is provided based on the first device information and a power consumption database generated by pre-measuring power consumption of the plurality of content in a predetermined reference device.

Here, the predetermined reference device may be a device specially manufactured to measure power consumption, or a device selected from among commercialized devices according to a predetermined standard.

For example, when a content provider provides content X, content Y, and content Z, the content provider may determine a portable phone that is most widely sold in a current market as a reference device, measure power consumption of the portable phone when the portable phone uses each of the content X, the content Y, and the content Z, and then generate a power consumption database by using the measured power consumption. Here, the power consumption database may not only be generated by the content provider, but also by an organization for testing devices, an organization for authorizing devices, or the like.

When the content provider or the like generates the power consumption database as such, the server receives the power consumption database from the content provider or the like, reads information about power consumption of the selected content from the power consumption database, and amends the read information about power consumption based on the first device information, thereby providing the estimated power consumption information of the first portable device in regard to the selected content.

For example, when a power consumption database stores power consumption information when a reference device having a 3 inch liquid crystal screen uses content X, and the estimated power consumption information of the first portable device having the same specification as the reference device except that the first portable device has a 1.5 inch liquid crystal screen is to be provided, the server may provide the estimated power consumption information of the first portable device on the content X by amending the power consumption information of the content X stored in the power consumption database by using a difference between power generally consumed by the 1.5 inch liquid crystal screen and power generally consumed by the 3 inch liquid crystal screen. In this example, since the liquid crystal screen of the first portable device is smaller than the liquid crystal screen of the reference device, the power consumption information of the content X stored in the power consumption database may have a smaller value than the estimated power consumption information of the first portable device. Here, a difference between powers due to different liquid crystal screens may be calculated directly by the server or received from outside the server.

If the server received the actual power consumption information of the second portable device and the second device information in step 120 and the second device information and the first device information are identical, the actual power consumption information of the second portable device may be provided together while providing the estimated power consumption information of the first portable device in regard to the selected content in step 130.

Here, the second device information may include manufacturer information of the second portable device, a manufacturer model of the second portable device, information about parts installed in the second portable device, and information about parts that power supply is blocked while measuring power consumption so as to generate the actual power consumption information, from among the parts installed in the second portable device.

The actual power consumption information is provided together as above because if it is determined that the second portable is the same manufacturer model as the first portable device after comparing the first and second device information, the actual power consumption information of the second portable device may be useful to the first portable device.

For example, when the first user received the estimated power consumption information of the first portable device on the selected content together with the actual power consumption information of the second portable device corresponding to the same manufacturer model as the first portable device, the actual power consumption information indicating an actual result of the manufacturer model that is the same as the first portable device may provide more accurate information to the first user than the estimated power consumption information, since the estimated power consumption information is estimated by amending the power consumption information of the content X read from the power consumption database according to the first device information. However, since an error may be generated while the second user generates the actual power consumption information, the first user may not trust the actual power consumption information if an error between the estimated power consumption information and the actual power consumption information is large.

Actual power consumption information may provide information that is not provided by the estimated power consumption information. For example, if the estimated power consumption information of the content X is estimated information when power is applied to all parts of the first portable device, and the actual power consumption information is information when power supplied to a Bluetooth module that is not required is blocked while using the content X, the user may determine information about power that may be saved when the Bluetooth module is turned off upon receiving both the estimated power consumption information and the actual power consumption information.

An application example using the method of FIG. 1 will now be described with reference to FIG. 2.

Figure 2:
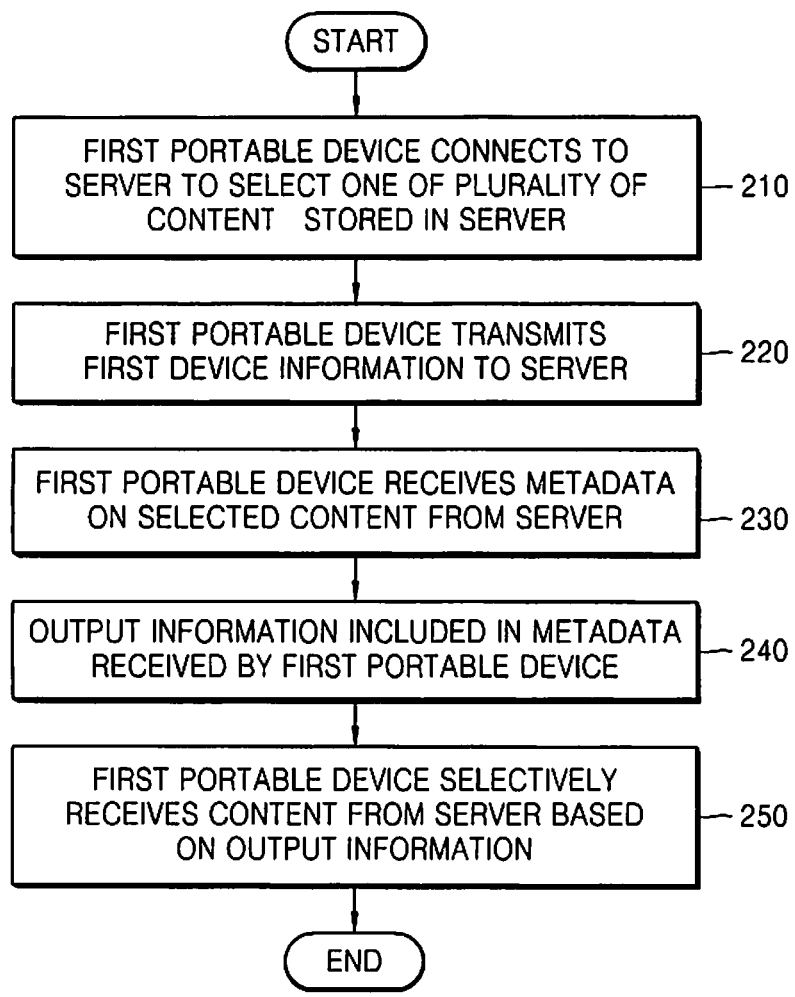
FIG. 2 is a flowchart for describing an application example using the method of FIG. 1.

FIG. 2 is a flowchart for describing an application example using the method of FIG. 1.

In step 210, the first portable device connects to the server and selects one of the plurality of content stored in the server.

Here, the first portable device may connect to the server by using the Internet or a wireless mobile communication network.

In step 220, the first portable device transmits the first device information to the server.

In step 230, the first portable device receives metadata about the selected content from the server. Here, the metadata includes the estimated power consumption information of the first portable device on the selected content.

If content is digital broadcast content, the server may provide the estimated power consumption information or the metadata to the first portable device through a data carousel for providing information about the digital broadcast content. Here, the data carousel denotes data periodically and repeatedly transmitted so as to provide the information about the digital broadcast content, and detailed descriptions thereof will be omitted since the data carousel is well known to those of ordinary skill in the art.

In step 240, the first portable device outputs information included in the received metadata.

Step 240 will be described later in detail with reference to FIGS. 3 and 4.

When the first user wishes to check metadata of another content instead of the selected content, steps 210 through 240 may be performed again in regard to the other content.

In step 250, the first portable device selectively receives the content from the server based on the output information.

For example, when the first user determines that the selected content would consume too much power by checking the estimated power consumption information through the first portable device, the first portable device may not receive the content, and when the first user determines that the selected content would consume a suitable amount of power, the first portable device may receive the content.

Conventionally, the first user only received information about power consumed by each device regardless of types of content, but according to the current embodiment of the present invention, the first user receives the estimated power consumption information of the first portable device in regard to the selected content, and thus the first user is able to selectively receive the content based on the estimated power consumption information of the selected content as in step 250.

Steps 210 through 250 are performed between the first portable device and the server. However, steps 210 through 250 may also be performed between a computer storing the first device information about the first portable device, and the server.

For example, the first user may select one of the plurality of content stored in the server, transmit the first device information to the server, and receive and output the metadata of the selected content by using the computer. Also, the selected content may be received through the content. However in this case, the received content may further be transmitted to the first portable device.

Figures 3, 4:
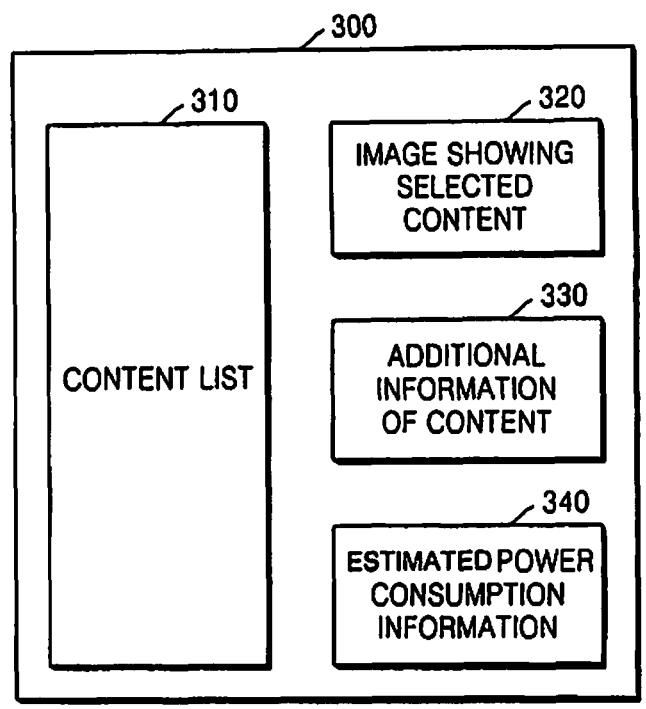
FIG. 3 is a diagram for describing a method of outputting information included in metadata of content, according to an embodiment of the present invention.
FIG. 4 is a diagram for describing a method of displaying estimated power consumption information of FIG. 3.

FIG. 3 is a diagram for describing a method of outputting information included in metadata of content, according to an embodiment of the present invention.

Referring to FIG. 3, the information included in the metadata of the content is output to a liquid crystal screen 300 of a first portable device.

A content list 310 includes a list of content stored in a server.

An image 320 about selected content is an image showing content selected from the content list 310.

Additional information 330 of content includes additional information, such as a genre, a server registration date, a version, a size, a usable age, an executable Operating System (OS), a price, etc., of the selected content.

Estimated power consumption information 340 includes information about power consumption estimated when the selected content is used by the first portable device. Here, the estimated power consumption information 340 may display the power consumption, which is estimated to occur when the selected content is used by the first portable device, in grades. For example, a plurality of power grades may be set based on amounts of power consumption, and one of the power grades may be displayed as the power consumption.

For example, a power grade may be a first grade when power consumption while using certain content is equal to or below 100 W, a power grade may be a second grade when power consumption while using certain content exceeds 100 W and equal to or below 200 W, a power grade may be a third grade when power consumption while using certain content exceeds 200 W and equal to or below 300 W, and a power grade may be a fourth grade when power consumption while using certain content exceeds 300 W. However, a range of power consumption corresponding to each power grade is not limited to the above example. Like an energy consumption efficiency grade in electrical devices, a grade is assigned to power consumption when content is used.

A method of displaying the estimated power consumption information 340 will now be described with reference to FIG. 4.

Alternatively, actual power consumption information of a second portable device may be further output to the liquid crystal screen of the first portable device.

FIG. 4 is a diagram for describing a method of displaying the estimated power consumption information of FIG. 3.

Referring to FIG. 4, the estimated power consumption information may be displayed as three types, i.e., (a), (b), and (c). Hereinafter, it is assumed that a estimated power consumption grade of the first portable device in regard to predetermined content is a first grade.

First, the estimated power consumption grade is indicated to be the first grade by only using characters and numbers as in (a).

Second, the estimated power consumption grade is indicated to be the first grade by using characters and a "star" image as in (b). Here, the number of stars increases in proportion to the grades.

Third, it is indicated in detail that estimated power consumption of the first portable device is 100 W per hour by using characters and numbers as in (c).

Here, (a) through (c) may be used together or modified. Also, the method is not limited to (a) through (c) of FIG. 4, but any method of displaying the estimated power consumption information of the first portable device may be used.

The first portable device according to an embodiment of the present invention may check and output a size of a memory, CPU usage, types of parts used by content, etc. when the first portable device uses the content stored in the first portable device.

Also, the first portable device according to an embodiment of the present invention may output a estimated amount of battery consumed while the first portable device uses the selected content, and power consumption information estimated when power supplied to parts that are not required to operate while using the selected content is blocked, from among parts installed in the first portable device.

For example, the first portable device may output a message "If this content is executed, an hour of battery use will be consumed. Do you want to proceed?" or a message "If a Wi-Fi function is turned off, 75 W of power will be consumed (100 W when Wi-Fi function is turned on)."

Figure 5:
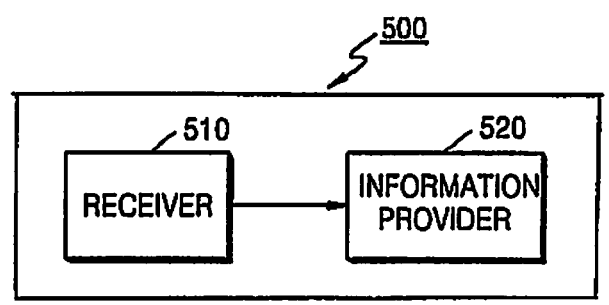
FIG. 5 is a block diagram of an apparatus for providing estimated power consumption information of content, according to an embodiment of the present invention.

FIG. 5 is a block diagram of an apparatus 500 for providing estimated power consumption information of content, according to an embodiment of the present invention.

Referring to FIG. 5, the apparatus 500 includes a receiver 510 and an information provider 520.

The receiver 510 receives a command for selecting one of a plurality of content, and receives first device information indicating information about a first portable device of a first user who is to use the selected content.

The information provider 520 provides power consumption information about the amount of power estimated to be consumed when the first portable device uses the selected content, based on the first device information received through the receiver 510, and a power consumption database.

For example, the information provider 520 may transmit estimated power consumption information of the first portable device to the first portable device. If the first device information is received from a computer, the information provider 520 may transmit the estimated power consumption information to the computer.

Alternatively, if the apparatus 500 is installed in a device having a display unit and the first user is within a distance capable of directly checking the display unit, the information provider 520 may provide the estimated power consumption information according to content to the display unit, and the first user may check the estimated power consumption information according to content in the first portable device through the display unit.

The embodiments of the present invention can be written as computer programs and can be implemented in general-use digital computers that execute the programs using a computer readable recording medium. Examples of the computer readable recording mediums include magnetic storage media (e.g., ROM, floppy disks, hard disks, etc.), and optical recording media (e.g., CD-ROMs, or DVDs).

While this invention has been particularly shown and described with reference to the described embodiments thereof, it will be understood by those of ordinary skill in the art that various changes in form and details may be made therein without departing from the spirit and scope of the invention as defined by the appended claims. The described embodiments should be considered in a descriptive sense only and not for purposes of limitation. Therefore, the scope of the invention is defined not by the detailed description of the invention but by the appended claims, and all differences within the scope are to be construed as being included in the present invention.

What is claimed is:

1. A method of providing power consumption information about an amount of power estimated to be consumed while using content, the method comprising:
   receiving a command for selecting one of a plurality of content from a device;
   receiving device information indicating the device of a user who is to use the selected content;
   comparing the device information and reference device information; and
   providing estimated power consumption information by using pre-measured power consumption information of the plurality of content as used in a reference device, based on a difference between a specification of the device indicated by the device information and a specification of the reference device indicated by the reference device information.

2. The method of claim 1, further comprising receiving actual power consumption information generated by measuring actual power consumption when a pre-determined device uses the selected content, and pre-determined device information indicating information about the pre-determined device,
   wherein providing the estimated power consumption information is performed further based on the actual power consumption information and the pre-determined device information.

3. The method of claim 2, wherein providing the estimated power consumption information comprises:
   providing information about parts to which power supply is blocked from among the parts installed in the device,
   wherein, the information about the parts generated based on the pre-measured power consumption and the actual power consumption information about parts installed in the pre-determined device and about parts to which power supply is blocked from among the parts installed in the pre-determined device, while measuring power consumption to generate the actual power consumption information.

4. The method of claim 1, wherein providing the estimated power consumption information comprises providing a power grade corresponding to power consumption estimated when the device uses the content, from among a plurality of power grades classified according to amounts of power consumption.

5. The method of claim 4, wherein providing the power grade comprises providing the power grade by using at least one of an image, a number, and a character.

6. A method of receiving power consumption information about an amount of power estimated to be consumed while using content, the method comprising:
   transmitting a command for selecting one of a plurality of content to a server;
   transmitting device information indicating a device which uses the selected content to the server; and
   receiving estimated power consumption information acquired by comparing the device information and reference device information,
   wherein the estimated power consumption information is acquired by using pre-measured power consumption information of the plurality of the content as used in a reference device, based on a difference between a specification of the device indicated by the device information and a specification of the reference device indicated by the reference device information.

7. The method of claim 6, wherein receiving the power consumption information comprises:
   receiving information about parts to which power supply is blocked from among the parts installed in the device,
   wherein the information about parts generated based on the pre-measured power consumption and actual power consumption information about parts installed in a pre-determined device and about parts to which power supply is blocked from among the parts installed in the pre-determined device, while measuring power consumption to generate the actual power consumption information.

8. The method of claim 6, wherein receiving the estimated power consumption information comprises receiving a power grade corresponding to power consumption estimated when the device uses the content, from among a plurality of power grades classified according to amounts of power consumption.

9. The method of claim 8, wherein receiving the power grade comprises receiving the power grade by using at least one of an image, a number, and a character.

10. An apparatus of providing power consumption information about an amount of power estimated to be consumed while using content, the apparatus comprising:

a receiver for receiving a command for selecting one of a plurality of content from a device and receiving device information indicating the device of a user who is to use the selected content; and an information provider for comparing the device information and reference device information and providing estimated power consumption information by using pre-measured power consumption information of the plurality of content as used in a reference device, based on a difference between a specification of the device indicated by the device information and a specification of the reference device indicated by the reference device information.

11. The apparatus of claim 10, wherein the receiver receives actual power consumption information generated by measuring actual power consumption when a pre-determined device uses the selected content, and pre-determined device information indicating information about the pre-determined device, and wherein the information provider provides the estimated power consumption information based on the actual power consumption and the pre-determined device information.

12. The apparatus of claim 11, wherein the information provider provides information about parts to which power supply is blocked from among the parts installed in the device, and wherein the information provided provides information about the parts generated based on the pre-measured power consumption and actual power consumption information about parts installed in the pre-determined device and about parts to which power supply is blocked from among the parts installed in the pre-determined device, while measuring power consumption to generate the actual power consumption information.

13. The apparatus of claim 10, wherein the information provider provides a power grade corresponding to power consumption estimated when the device uses the content, from among a plurality of power grades classified according to amounts of power consumption.

14. The apparatus of claim 13, wherein the information provider provides the power grade by using at least one of an image, a number, and a character.

15. An apparatus of receiving power consumption information about an amount of power estimated to be consumed while using content, the apparatus comprising:

transmitter for transmitting a command for selecting one of a plurality of content to a server and transmitting device information indicating a device which uses the selected content to the server; and receiver for receiving estimated power consumption information acquired by comparing the device information and reference device information, by using pre-measured power consumption information of the plurality of the content as used in a reference device, based on a difference between a specification of the device indicated by the device information and a specification of the reference device indicated by the reference device information.

16. The apparatus of claim 15, wherein the receiver receives information about parts to which power supply is blocked from among the parts installed in the device, and wherein the receiver receives the information about parts generated based on the pre-measured power consumption and actual power consumption information about parts installed in a pre-determined device and about parts to which power supply is blocked from among the parts installed in the pre-determined device, while measuring power consumption to generate the actual power consumption information.

17. The apparatus of claim 15, wherein the receiver receives a power grade corresponding to power consumption estimated when the device uses the content, from among a plurality of power grades classified according to amounts of power consumption.

18. The apparatus of claim 17, wherein the receiver receives the power grade comprises receiving the power grade by using at least one of an image, a number, and a character.

19. A non-transitory computer readable recording medium having recorded thereon a program for performing a method of providing power consumption information about an amount of power estimated to be consumed while using content, the method comprising:

receiving a command for selecting one of a plurality of content from a device;

receiving device information indicating the device of a user who is to use the selected content;

comparing the device information and reference device information; and providing estimated power consumption information by using pre-measured power consumption information of the plurality of content as used in a reference device, based on a difference between a specification of the device indicated by the device information and a specification of the reference device indicated by the reference device information.

20. A non-transitory computer readable recording medium having recorded thereon a program for performing the method of receiving power consumption information about an amount of power estimated to be consumed while using content, the method comprising:

transmitting a command for selecting one of a plurality of content to a server;

transmitting device information indicating a device which uses the selected content to the server; and receiving estimated power consumption information acquired by comparing the device information and reference device information, wherein the estimated power consumption information is acquired by using pre-measured power consumption information of the plurality of the content as used in a reference device, based on a difference between a specification of the device indicated by the device information and a specification of the reference device indicated by the reference device information.

* * * * *